(12) United States Patent
Voiron et al.

(10) Patent No.: US 12,477,758 B2
(45) Date of Patent: Nov. 18, 2025

(54) SEMICONDUCTOR STRUCTURE ENHANCED FOR HIGH VOLTAGE APPLICATIONS

(71) Applicant: Murata Manufacturing Co., Ltd., Nagaokakyo (JP)

(72) Inventors: Frédéric Voiron, Barraux (FR); Larry Buffle, Caen (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/117,466

(22) Filed: Dec. 10, 2020

(65) Prior Publication Data

US 2021/0091174 A1   Mar. 25, 2021

Related U.S. Application Data

(63) Continuation of application No. PCT/IB2019/000515, filed on Jun. 19, 2019.

(30) Foreign Application Priority Data

Jun. 21, 2018 (EP) ..................... 18305789

(51) Int. Cl.
  *H10D 1/68* (2025.01)
  *H01L 21/302* (2006.01)
  *H01L 21/3213* (2006.01)
  *H10D 1/66* (2025.01)
  *H10D 89/10* (2025.01)

(52) U.S. Cl.
  CPC .......... *H10D 1/716* (2025.01); *H01L 21/302* (2013.01); *H01L 21/3213* (2013.01); *H10D 1/66* (2025.01); *H10D 89/10* (2025.01)

(58) Field of Classification Search
  CPC ........ H01L 29/94; H01L 29/945; H01L 28/90
  See application file for complete search history.

(56) References Cited

U.S. PATENT DOCUMENTS

| 2010/0230776 A1* | 9/2010 | Gogoi | H01L 29/66181 257/E21.532 |
| 2011/0180931 A1 | 7/2011 | Roozeboom et al. | |
| 2011/0244302 A1* | 10/2011 | Wasson | H01G 4/33 216/6 |

(Continued)

FOREIGN PATENT DOCUMENTS

WO   2009150600 A1   12/2009

OTHER PUBLICATIONS

Gruenler, S., et al.; "High-Voltage Monolithic 3D Capacitors based on Through-Silicon-Via Technology"; IEEE International Interconnect Technology Conference and IEEE Materials for Advanced Metallization Conference, May 18-21, 2015, Grenoble; Downloaded on Dec. 10, 2020 from IEEE Xplore, pp. 253-256.

(Continued)

*Primary Examiner* — Raj R Gupta
(74) *Attorney, Agent, or Firm* — ArentFox Schiff LLP

(57) ABSTRACT

A semiconductor structure that includes a protruding wall structure that extends from a base surface of a substrate. Corners of the protruding wall structure may be smoothed or rounded to reduce electrical stress within the structure. The protruding wall structure may be partitioned into multiple wall regions disposed along different directions of the substrate to reduce mechanical stress.

11 Claims, 7 Drawing Sheets

(56) References Cited

U.S. PATENT DOCUMENTS

2013/0161792 A1* 6/2013 Tran ................ H01L 29/66083
438/386

OTHER PUBLICATIONS

International Search Report issued for PCT/IB2019/000515, date of mailing Dec. 16, 2019.
Written Opinion of the International Searching Authority issued for PCT/IB2019/000515, date of mailing Dec. 16, 2019.

* cited by examiner

SEMICONDUCTOR STRUCTURE ENHANCED FOR HIGH VOLTAGE APPLICATIONS

CROSS REFERENCE TO RELATED APPLICATIONS

The present application is a continuation of International application No. PCT/IB2019/000515, filed Jun. 19, 2019, which claims priority to European Patent Application No. 18305789.2, filed Jun. 21, 2018, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Increasing capacitance density is a key objective in the development of emerging capacitive components. In the case of silicon-integrated capacitors, one approach to boost capacitance density includes increasing the specific surface of the capacitive structure by 3D-structuring the surface of the silicon wafer. This allows a reduction of die surface and brings silicon-integrated capacitive technology to a level of integration that matches implementation requirements of low-voltage applications.

However, in the emerging field of high voltage applications (steered by the roadmap of integrated power technology like GaN (gallium nitride) and SiC (silicon carbide)), capacitive technology integration remains largely unstudied. In such applications, to prevent early fails and/or premature wear out of the capacitive device, the operating electric field must be guaranteed with a sufficient margin for the desired lifetime of the device. One way to sustain the operating electrical field is by increasing the thickness of the dielectric layer. However, existing silicon processing technology for high voltage or power applications (e.g., greater than 500 Volts) is incompatible with large dielectric thickness.

For example, Gruenler et al. ("High-voltage monolithic 3D capacitors based on through-silicon-via technology, IEEE International Interconnect Technology Conference and IEEE Materials for Advanced Metallization Conference, 18-21 May 2015, Grenoble) proposes a 3D capacitor for high-voltage applications. An example 100 of Gruenler's capacitor is shown in FIG. 1. As shown, the capacitor 100 includes a substrate 102 having etched therein an array of cylindrical capillaries. The cylindrical capillaries are filled with a capacitive structure consisting of a semiconductor layer 104, a dielectric layer 106, a polysilicon layer 108, and a metal layer 110. The semiconductor layer 104 and the metal layer 110 provide a bottom electrode and a top electrode respectively for the capacitive structure.

Gruenler's 3D capacitor structure however is not well-suited for utilizing a large dielectric thickness. In one aspect, the 3D structure has a poor permeability to process gases, which complicates the processes for etching the cylindrical capillaries and depositing the capacitive structure. In another aspect, the structure suffers from a high level of mechanical stress once the cylindrical capillaries are filled by the capacitive structure. The high mechanical stress leads to substantial wafer warpage, complicating even further subsequent process steps. A thicker dielectric would exacerbate both deficiencies of Gruenler's structure, rendering capacitive integration even more complex. Moreover, it would significantly increase the probability of defects created or occurring in the dielectric coating (e.g., dielectric cracking or delamination), leading to random device breakdown.

Accordingly, there is a need for an improved structure suited for high-voltage applications.

SUMMARY OF THE INVENTION

The present invention provides a structure, comprising:
a substrate; and
a protruding wall structure, preferably formed by etching the substrate, that extends upwards from a base surface of the substrate, the protruding wall structure being continuous and forming at least first and second wall regions,
wherein a corner of the protruding wall structure is rounded.

The rounding of the corner of the protruding wall structure results in a more uniform distribution of electrostatic field at the corner when an electrical device, such as a capacitor for example, is formed in the wall structure. This reduces electrical stress within the structure and enables it to better withstand the operating electrical field of high-voltage applications. Improved performance in terms of breakdown voltage, leakage, product reliability and yield follows as a result. The rounding of the corner also reduces mechanical stress within the structure when a dielectric layer is used to coat the structure. Generally, high mechanical stress occurs in the dielectric layer when it is laid over a sharp edge or corner. Rounding the corner reduces this mechanical stress. Moreover, rounding the corner leads to a more uniform dielectric layer in terms of thickness (i.e., less voiding), which is beneficial to dielectric layer performance enhancement.

The protruding nature of the wall structure results in several advantages. Indeed, the open, protruding geometry makes the structure more favorable to gas circulation during etching and enhances its permeability to plasma. This results in easier (i.e., faster and more uniform) etching and oxide deposition processes, including easier access to round singular points (e.g., corners) of the structure to reduce electrical stress. The protruding geometry also translates into reduced mechanical stress and wafer bow. This further facilitates subsequent processing and reduces the probability of defects occurring within the structure. All of these advantages contribute toward the structure's compatibility with the use of a thicker dielectric, and by consequence its suitability for high-voltage applications.

In an embodiment, a multi-layer device is formed in the wall structure, at least one layer of the multi-layer device deposited over the rounded corner. The multi-layer device may comprise one or more structures of: a metal-insulator-semiconductor (MIS) structure, a semiconductor-insulator-semiconductor (SIS) structure, or a metal-insulator-metal (MIM) structure. The one or more structures may be stacked in series.

In an embodiment, an electrode of the multi-layer device is provided by the substrate of the structure.

The space comprised in between the protruding wall structure may be partially unfilled after formation of the multi-layer device therein. This helps further reduce mechanical stress within the resulting structure.

In an embodiment, a curvature radius of the rounded corner is proportional to a thickness of the multi-layer device. In another embodiment, the curvature radius of the rounded corner is greater than a thickness of an insulator layer of the multi-layer device. In yet another embodiment, the curvature radius of the rounded corner is greater than double a thickness of an insulator layer of the multi-layer device.

In an embodiment, the space comprised in between the protruding wall structure forms a continuous pattern over the base surface of the substrate.

The first and second wall regions comprise walls having limited lengths. In an embodiment, walls of the first wall region may be disposed along a first direction of the substrate and walls of the second wall region may be disposed along a second direction of the substrate. The first direction and the second direction may form a defined angle with each other. The defined angle may be selected to reduce mechanical stress within the structure. In an embodiment, walls of the first wall region and walls of the second wall region are disposed symmetrically to balance mechanical stress along the first direction and the second direction of the substrate, which contributes to reducing wafer bow.

The rounded corner of the protruding wall structure may fall in a plane that is perpendicular or parallel to the base surface of the substrate. In an embodiment, every corner of the protruding wall structure is rounded, whether falling in a plane that is perpendicular or parallel to the base surface of the substrate.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention address the existing deficiencies of the prior art by providing a structure that is enhanced for high-voltage applications.

In one aspect, the proposed structure's geometry is adapted to reduce or prevent electrical field concentration within the structure. This reduces electrical stress within the structure and enables it to better withstand the operating electrical field of high-voltage applications. Improved performance in terms of breakdown voltage, leakage, product reliability and yield follows as a result.

Figure 2:
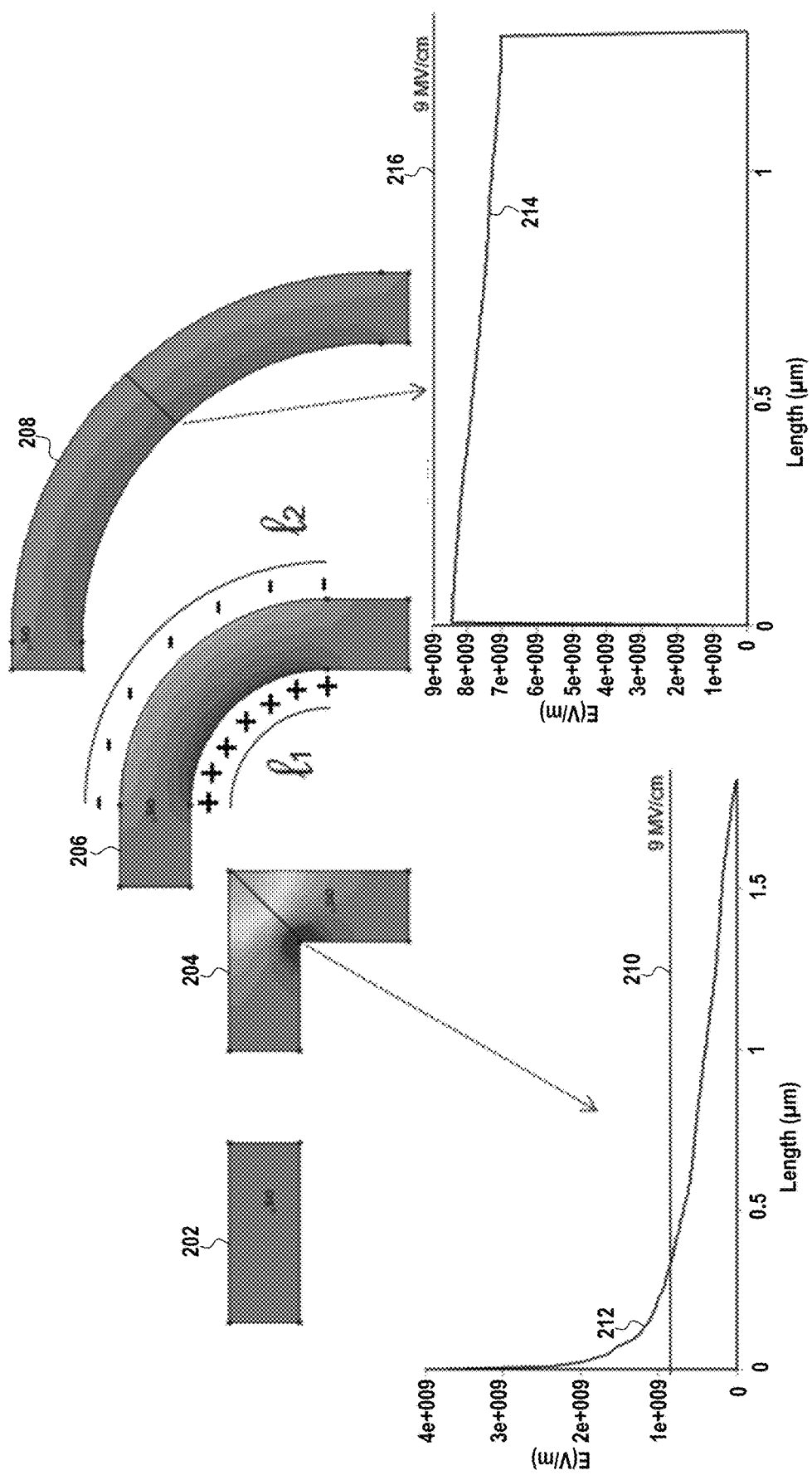
FIG. 2 illustrates the distribution of the electrostatic field magnitude inside a silicon dioxide dielectric for different electrode geometries.

To illustrate the relationship between electrical stress within a structure and the structure's geometry, FIG. 2 shows the distribution of the electrostatic field magnitude, at 600 Volts, inside a silicon dioxide dielectric for different example electrode geometries 202, 204, 206, and 208. The dielectric is sandwiched by opposite top and bottom electrodes (not shown in FIG. 2).

The electrostatic field magnitude at a given point of the electrode geometry is directly related to the local difference of charge density between the opposite electrodes. As such, where the electrode geometry is uniform, such as electrode geometry 202, the electrostatic field is evenly distributed across the electrode geometry. As shown by the curve 210, the electrostatic field magnitude thus remains constant over the entirety of the electrode geometry.

However, when the electrode geometry contains a singular point, e.g., a sharp corner as in electrode geometry 204, the difference of length/surface between the opposite electrodes at the singular point induces a difference of charged density near the singular point. For example, in electrode geometry 204, the inner contour of the sharp corner has a smaller length/surface than the outer contour of the corner. Respecting the principle of overall electrostatic neutrality (i.e., that the integral of charges on the top electrode is equal to the integral of charges on the bottom electrode), a higher charge accumulation occurs on the corner of the bottom electrode (i.e., the inner electrode protruding into the dielectric) than on the corner of the top electrode (i.e., the outer electrode overlying the dielectric). As a consequence, at the sharp corner, the electrostatic field exhibits a peak in magnitude as shown by the curve 212. In practical terms, the peaking electrostatic field magnitude reflects the presence of very high electrostatic fields that may exceed the dielectric strength and thus lead to faster dielectric wear out and/or earlier breakdown.

Embodiments of the present invention seek to reduce local concentrations of electrostatic field in the structure by smoothing or rounding singular points (e.g., corners, peaks, etc.) in the geometry. The effect of this smoothing or rounding is illustrated by example electrode geometries 206 and 208. As shown by the curve 214, the rounded electrode geometry 206 exhibits a smooth distribution of electrostatic field magnitude. Though the electrostatic field magnitude is not constant across the geometry, it does not exhibit a peak as in the case of electrode geometry 204, for example. Further increase of the curvature radius, as in electrode geometry 208, ensures greater matching between the top and bottom electrode surfaces. This translates into a substantially constant electrostatic field magnitude as shown by the curve 216.

Figure 1:
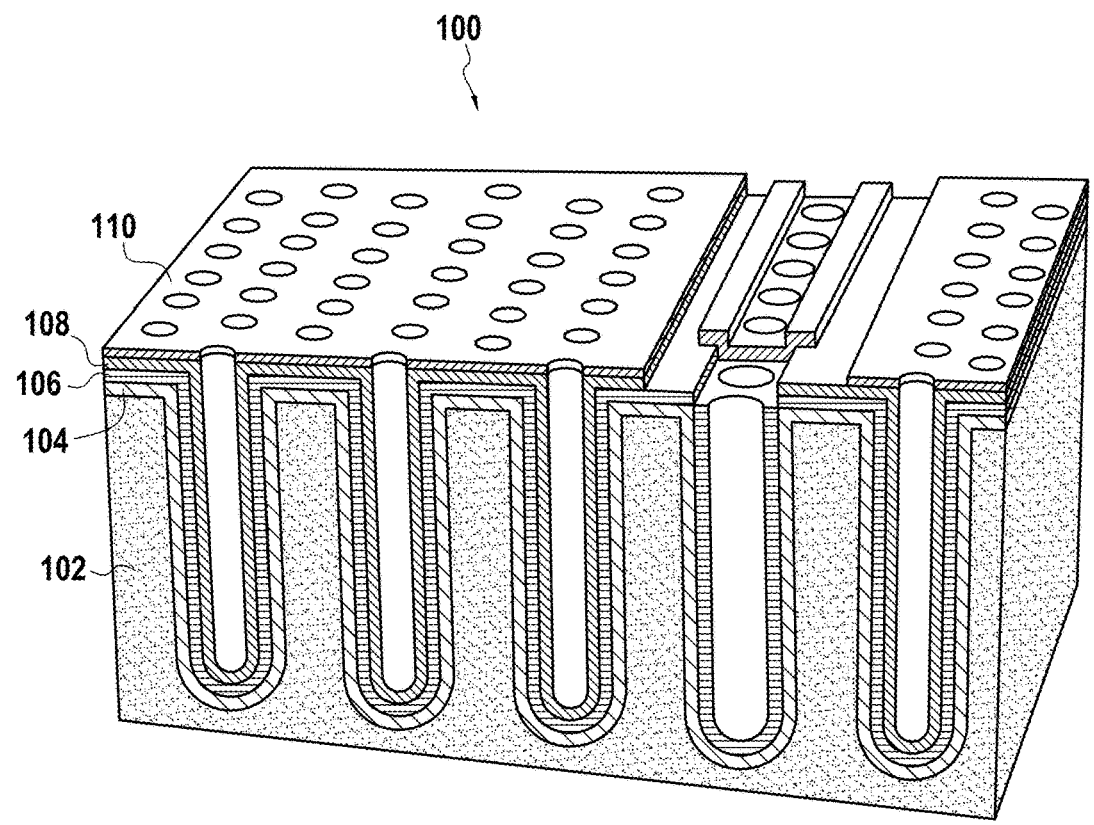
FIG. 1 is a perspective view of a conventional integrated capacitor.
Figure 3:
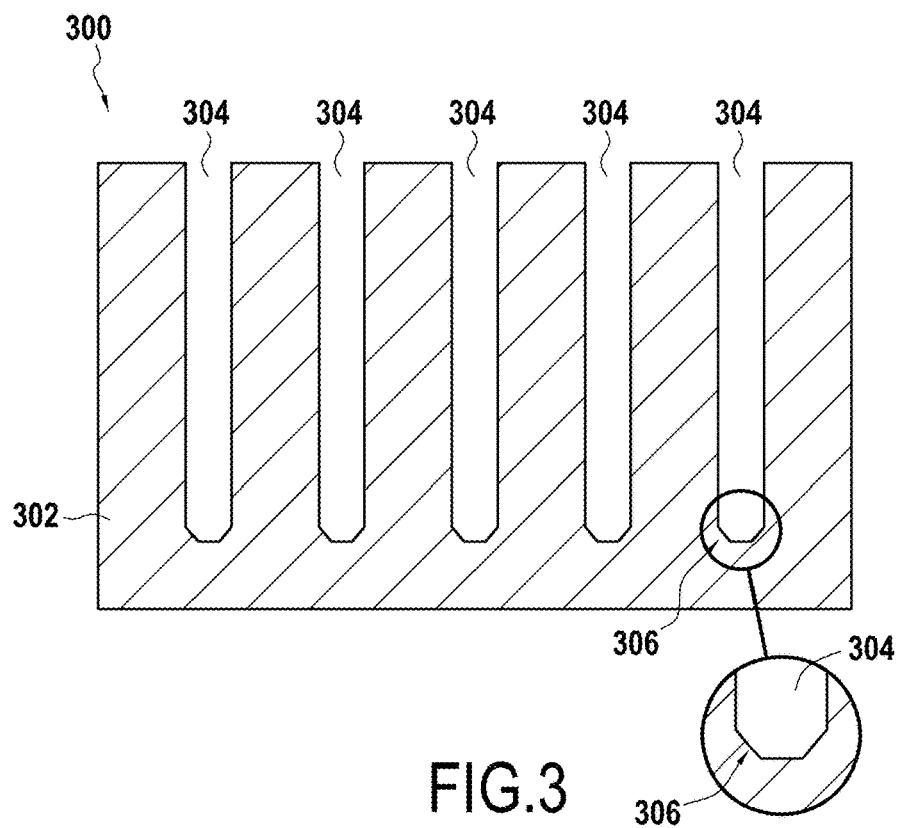
FIG. 3 is a cross-section view of a trench structure of the prior art.

In implementation, the rounding of singular points is not a straightforward task. For example, a trench capacitor structure 300 shown in cross-section in FIG. 3 illustrates a conventional capacitor structure disclosed by Tran et al. (US 2013/0161792 A1). The trench capacitor structure 300 is obtained by etching trenches 304 into a wafer 302. Top and/or bottom corners, e.g., corner 306, of the trenches 304 may be chamfered or rounded. In practice, however, realizing Tran's structure is challenging as the trench geometry is not conducive to the etching processes required to round the corners, particularly the bottom corners, such as corner 306 for example. The effect of smoothing or rounding is thus suboptimal, if not negligible, on reducing the electrical stress.

Figure 4:
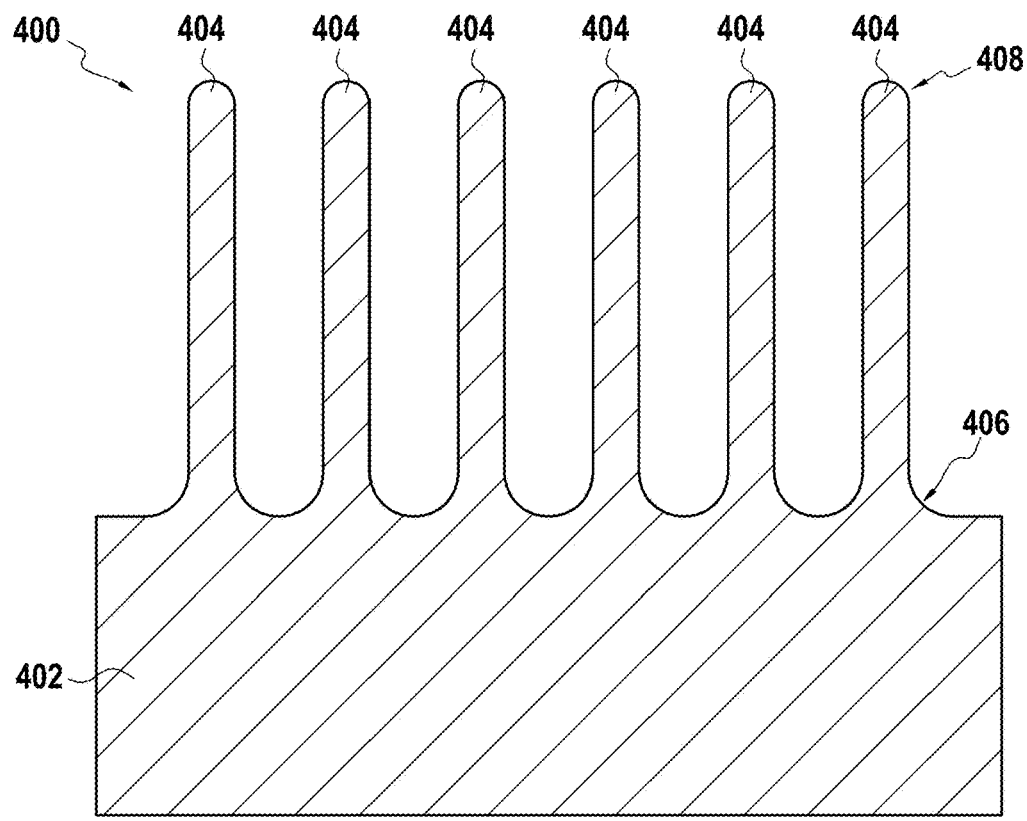
FIG. 4 is a cross-section view of a structure according to an embodiment of the present invention.

According to one aspect, embodiments of the present invention facilitate the rounding of singular points by adopting a structure in which the corners can be better reached by the etching processes. In an embodiment, as shown in FIG. 4, a mirror image of a trench structure is used. Specifically, the resulting structure 400 is obtained by etching a substrate 402 to form a protruding wall structure that extends upwards from a base surface of the substrate 402. The protruding wall structure includes a plurality of slim walls 404 over and between which the capacitive device can be deposited.

In an embodiment, a multi-layer device (not shown in FIG. 4) may be formed in the protruding wall structure, with at least one layer of the multi-layer device being deposited over a rounded corner of the structure 400.

In an embodiment, the rounded corner may be configured to have a curvature radius that is proportional to a thickness of the multi-layer device. For example, the curvature radius of the rounded corner may be configured to be greater than a thickness of an insulator or dielectric layer of the multi-layer device. In another embodiment, the curvature radius of the rounded corner may be configured to be greater than double the thickness of an insulator or dielectric layer of the multi-layer device.

The multi-layer device may comprise one or more structures of: a metal-insulator-semiconductor (MIS) structure, a semiconductor-insulator-semiconductor (SIS) structure, or a metal-insulator-metal (MIM) structure, for example. In an embodiment, the one or more structures may be stacked in series. In an embodiment, an electrode of the multi-layer device may be provided by the substrate 402.

In an embodiment, the protruding wall structure of structure 400 may be partially unfilled after formation of the multi-layer device therein. This helps reduce mechanical stress within the resulting capacitive structure.

The large spacing between the walls 404 (as opposed to the narrow volumes of the trenches in Tran's structure) allows for any corner of the structure 400 to be easily reached for rounding. In an embodiment, corners falling in planes perpendicular to the base surface of the substrate 402 may be rounded. An example of such corners may be corners 406 and 408 which fall in the plane of the figure.

In another embodiment, corners falling in planes parallel to the base surface of the substrate 402 may be rounded. Such corners may occur in the vertical side edges of the walls 404, i.e., the edges of the walls 404 rising up from the base surface of the substrate 402.

In yet another embodiment, all corners of the structure 400 (whether falling in a plane perpendicular or parallel to the base surface of the substrate 402) may be rounded.

Typically, the rounding of corners falling in planes parallel to the base surface of the substrate 402 can be controlled by the layout. For example, a hardmask pattern that results in those corners being rounded may be used to etch the substrate 402 to obtain the protruding wall structure. In general, this process can be controlled with ease and high precision.

Figure 5:
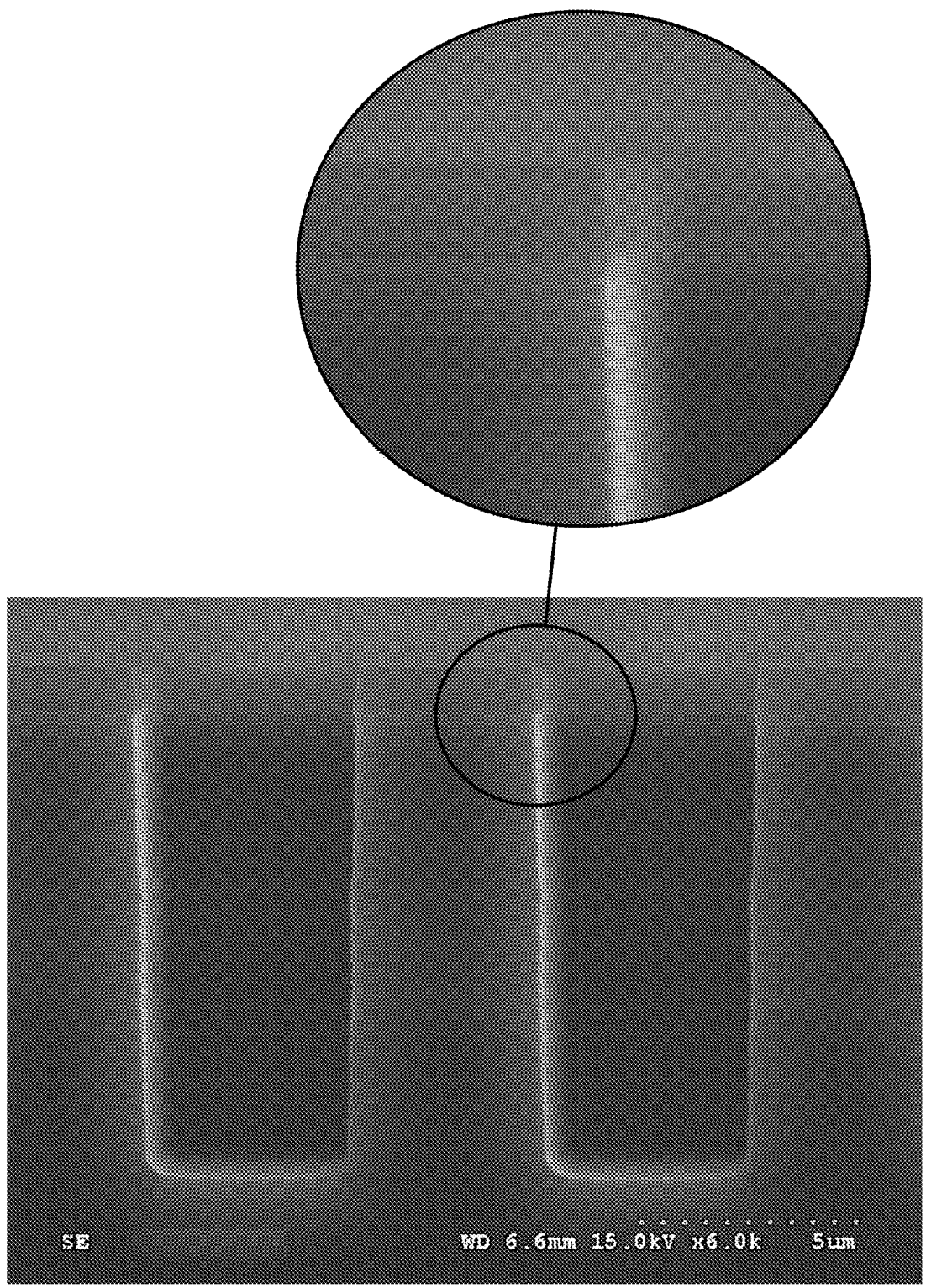
FIG. 5 is a scanning electron microscopy (SEM) image of a structure formed by deep etching of a silicon wafer.

However, the control of the rounding may be more difficult for corners, such as corners 406 and 408, which fall in planes that are perpendicular to the base surface of the substrate 402. Typically, in a silicon wafer, the shape of such corners depends directly on the used etching process. When a deep etching process through a silicon dioxide hardmask is used, the resulting corners are usually sharp or may have a sharp ledge. This is illustrated, for example, in FIG. 5 which is a scanning electron microscopy (SEM) image of a structure formed by deep reactive-ion etching (DRIE) of a silicon wafer. In addition, a scalloping effect may occur at the portions of the walls adjoining the corners as shown by the zoomed-in view in FIG. 5.

One approach to obtain better rounding of the corners relies on isotropic dry etching to consume the sharp edges. However, while such an approach may be effective to control the rounding at the tips of the walls, it is less effective for deeper down portions of the walls and, as such, at reducing the scalloping effect.

Another approach is based on a wet etching process that removes a sacrificial thermal oxide layer formed on the silicon surface. This approach has the advantage of having a conformal growth along the contours of the corners, thus being efficient at reducing the scalloping effect.

Figure 6:
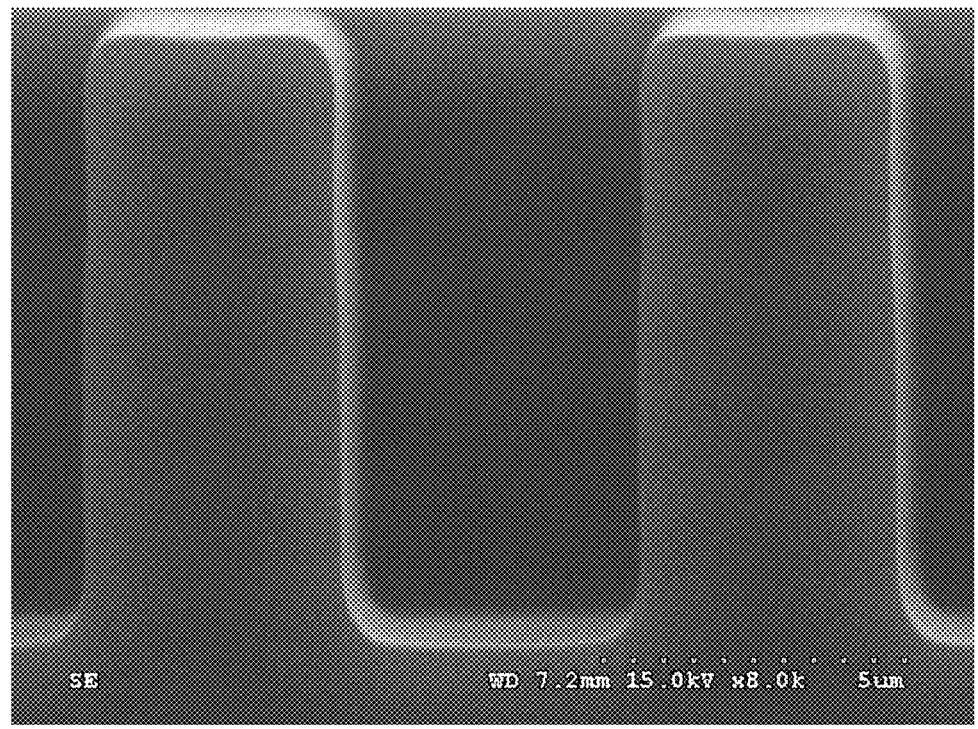
FIG. 6 illustrates is an SEM image of a structure formed according to an embodiment of the present invention.

A further approach uses high temperature annealing of the silicon under low pressure hydrogen (e.g., 100 Torr, 1100° C.). An SEM image of a structure formed using this process according to an embodiment is shown in FIG. 6. As shown, the structure exhibits well-rounded corners and no scalloping. The curvature radius of the corners according to this approach is a function of the thermal budget and time. Specifically, the rounding process is controlled by the reduction of the surface energy on the outer wall of the structure. This results in the process being self-limiting, i.e., effecting higher rounding rates in sharp areas compared to flat or pre-rounded areas. A more homogeneous structure is thereby produced.

Figure 7A:
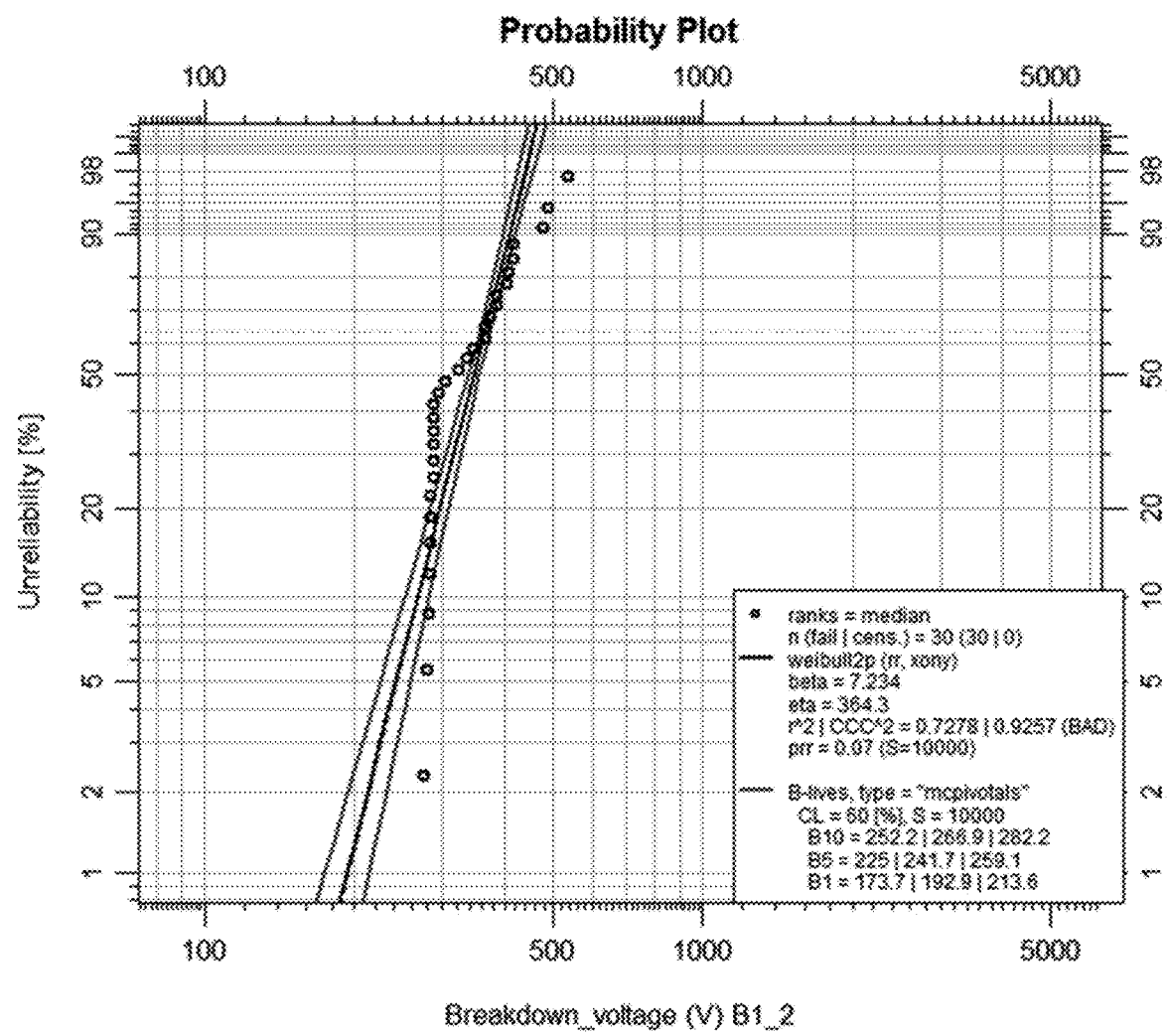
FIGS. 7A and 7B illustrate the effect of rounding on breakdown field distribution.
Figure 7B:
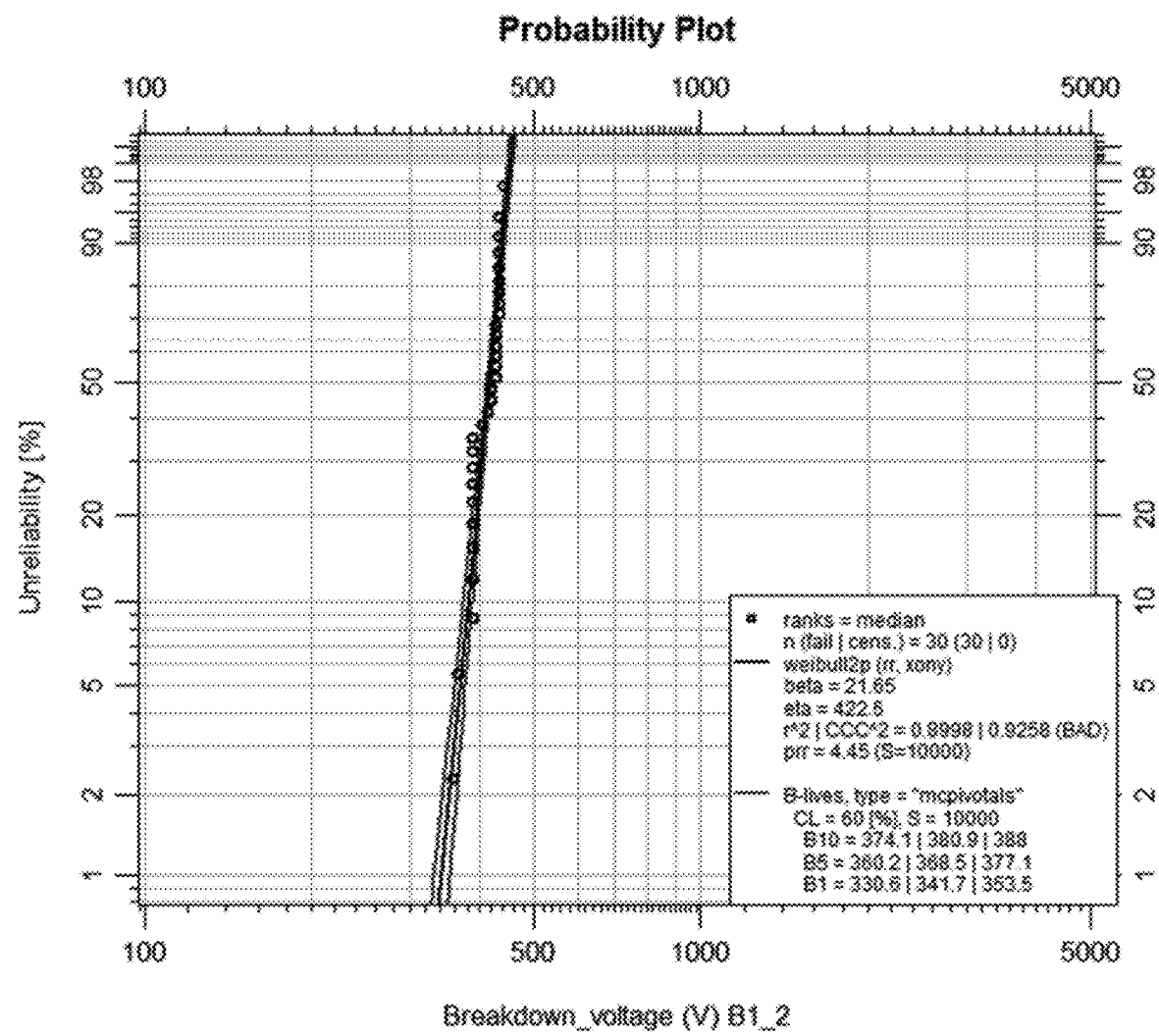

The performance of a structure obtained according to this high temperature annealing approach is illustrated in FIGS. 7A and 7B. Specifically, FIG. 7A is a Weibull plot of unreliability percentage to breakdown voltage for an unrounded structure (As breakdown is a physical mechanism that depends on the failure of the weakest element in a chain, the failure distribution follows not a normal law (Gaussian) distribution but a Weibull distribution. The plot shown in FIG. 7A represents a linearization of experimental data on a Weibull plot). FIG. 7B illustrates the same plot for the rounded structure. The unreliability percentage represents the probability that the structure (e.g., capacitor) fails at the breakdown voltage.

As shown, the rounded structure exhibits a steeper breakdown voltage distribution than the unrounded structure. The steepness of the distribution (represented by its beta factor) reflects how scattered the breakdown voltage population is (the higher the beta is, the less scattered the distribution is). In other words, devices (e.g., capacitors) formed using the rounded structure have a more uniform breakdown voltage performance than devices formed using the unrounded structure (e.g., for a given stress voltage, the best and worst devices of the rounded structure population would have a smaller lifetime difference than the best and worst devices of the unrounded structure population).

The rounded structure also exhibits a higher T63 than the unrounded structure. The T63 of a Weibull distribution is the equivalent of the average for a normal distribution; in other words, the T63 represents where the breakdown voltage distribution is centered. As shown from FIGS. 7A and 7B, the T63 of the rounded structure is equal to 422 V compared to 364 V for the unrounded structure. This means that the rounded structure has a higher average breakdown voltage than the unrounded structure.

In another aspect, the proposed structure's geometry is adapted to reduce mechanical stress within the structure. This feature reduces the probability of defects occurring in the dielectric layer and renders the structure more amenable to increasing the dielectric thickness. Indeed, as discussed above, to sustain high voltages, the dielectric layer needs to be deposited in a thick layer for high-voltage applications. For example, for an oxynitride layer deposited by LPCVD (Low Pressure Chemical Vapor Deposition), a dielectric thickness greater than 1.5 microns is typically needed for a 900 Volts breakdown voltage. When embedded in a high aspect ratio structure, such thick dielectric results in high mechanical stress, causing such things as layer cracking and peeling, dielectric cracking at sharp corners, and/or excessive bowing of the silicon wafer which prevents proper processing. For example, using the described dielectric layer, a wafer curvature radius as low as 12 m was observed in experiments. Without further steps to address this bowing in the wafer, the resulting structure would not be compatible with conventional lithographic steps (e.g., de-focus, handling, and/or clamping issues could arise).

The proposed structure reduces mechanical stress by virtue of its open, protruding geometry. Indeed, by being attached to the substrate only by its bottom surface, the proposed structure is free to accommodate stress along its height by bending, without transmitting high strain to the substrate. In contrast, in a trench structure as illustrated in FIG. 3 for example, the narrow trenches are delimited both from the top and the bottom, by a stiff network of walls connected to the substrate. The stress that builds within the trenches upon deposition of the capacitive device can thus only be transferred to the substrate.

The difference in built-in mechanical stress between the two structures can be readily determined by comparing the wafer bow of the two structures. Indeed, experiments have shown that, for a given dielectric layer and equivalent geometries, the ratio of wafer curvature radii between a protruding wall structure and a conventional trench structure may be larger than 20 (e.g., in an experiment, the curvature radius of the protruding wall structure was greater than 250 meters, whereas that of the conventional trench structure was equal to 12 meters).

Having a lower mechanical stress, embodiments of the present invention can accommodate a higher dielectric thickness than conventional structures, thereby achieving superior performance for high-voltage applications. In an embodiment, mechanical stress may be reduced further within the proposed structure by leaving the protruding wall structure partially unfilled after formation of the capacitive device therein.

Figure 8:
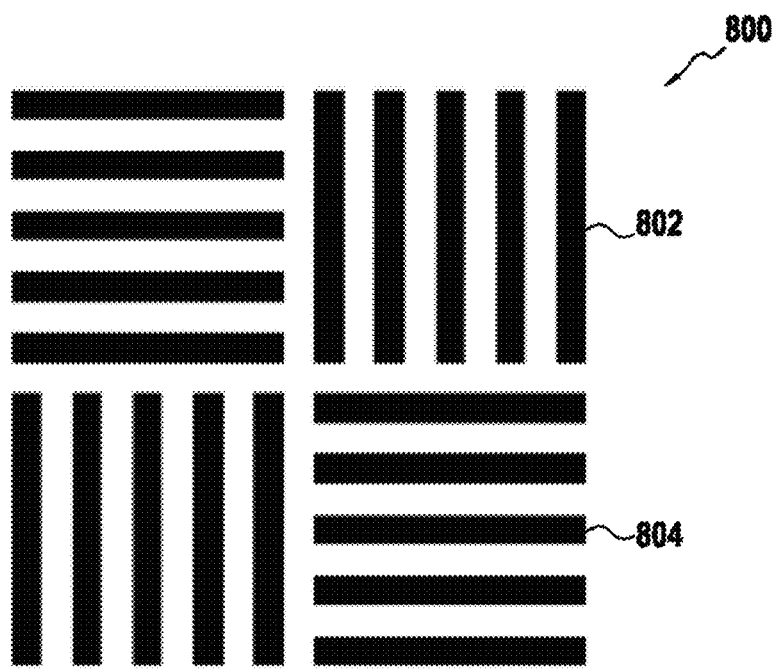
FIG. 8 is a top view of a structure according to an embodiment of the present invention.

In a further aspect, mechanical stress in the proposed structure is further reduced by forming wall regions within the structure that are disposed in different directions along the substrate. This aspect is illustrated in FIG. 8, which is a top view of a structure 800 according to an embodiment. For the purpose of simplification, the rounding of corners is not shown in FIG. 8.

As shown in FIG. 8, structure 800 includes a plurality of wall regions, such as first and second wall regions 802 and 804. Each wall region comprises multiple walls having limited lengths. In an embodiment, the walls forming a wall region may be disposed along either a first direction or a second direction of the substrate. In other embodiments, more than two directions may be used. For example, in structure 800, the walls of the first wall region 802 are disposed along a first direction, and the walls of the second wall region 804 are disposed along a second direction.

The first direction and the second direction may form a defined angle with each other. The defined angle may be selected to reduce mechanical stress within the structure. In an embodiment, the first direction may be perpendicular to the second direction. However, embodiments are not limited to this implementation and other angle relationships (e.g., 10, 20, 30, 40, 60, and 120 degrees) between the first direction and the second direction may be used.

In an embodiment, wall regions disposed along the first directions and wall regions disposed along the second direction are disposed symmetrically to reduce mechanical stress along the first direction and the second direction. In an embodiment, a wall region disposed along the first direction is surrounded along its sides by walls region disposed along the second direction, and vice versa.

Figure 9:
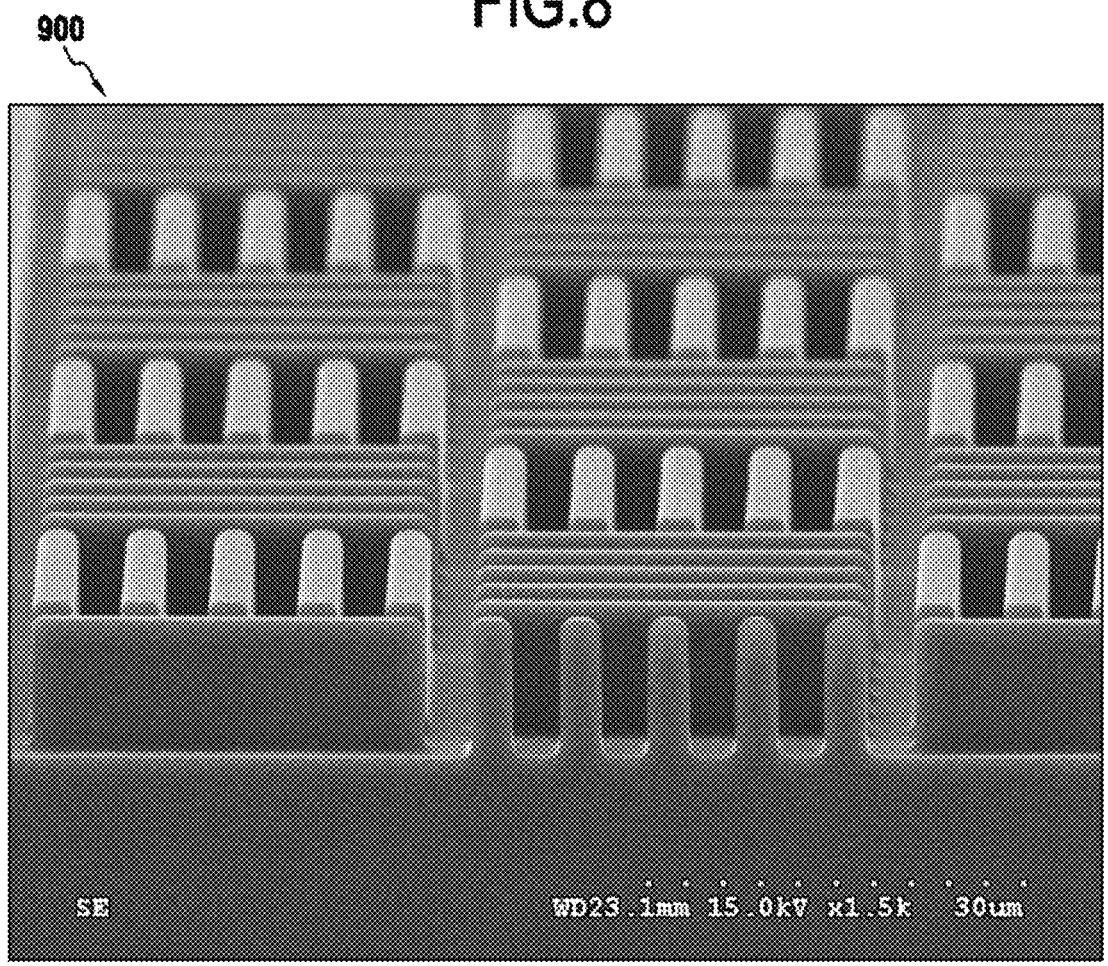
FIG. 9 is an SEM image of a structure according to an embodiment of the present invention.

FIG. 9 is an SEM image of a structure according to an embodiment of the present invention. As shown, according to this embodiment, all corners of the protruding wall structure are rounded. Additionally, the structure is partitioned into wall regions disposed symmetrically along first and second perpendicular directions. Both electrical stress and mechanical stress are substantially reduced within the structure, rendering it highly-suited for high-voltage applications and for the use of a thicker dielectric layer.

In a further aspect, the proposed structure is characterized by a 3D geometry that facilitates the process of integrating a capacitive device therein. Indeed, by having a protruding wall structure instead of narrow trenches, the structure is more favorable to gas circulation during etching and has better permeability to plasma. This results in easier (i.e., faster and more uniform) etching and oxide deposition processes. This is particularly true when DRIE is used to etch the wall structure and chemical vapor deposition (e.g., LPCVD) is used to deposit the dielectric. The open structure also renders the rounding of corners easier. Moreover, the lower mechanical stress and wafer bow facilitate subsequent processing.

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A structure, comprising:
    a substrate having a base surface defining a periphery of the substrate; and
    a protruding wall structure that extends upwards from the base surface of the substrate, the protruding wall structure being a continuous pattern having at least first and second wall regions, the first and second wall regions having upper ends above the base surface of the substrate, the protruding wall structure being within the periphery of the substrate, and wherein a corner of the protruding wall structure is rounded;
    a multi-layer device in the protruding wall structure, the multi-layer device including two electrodes that face each other with an insulator layer therebetween, at least one layer of the multi-layer device extending over the rounded corner,
    wherein the first and second wall regions comprise walls extending between the base surface and the upper ends above the base surface of the substrate, the walls having no scalloping,
    wherein a curvature radius of the rounded corner is greater than double a thickness of the insulator layer of the multi-layer device, and
    wherein an electrode geometry of the multilayer device is uniform such that an electrostatic field is evenly distributed in the insulator layer.

2. The structure of claim 1, wherein the walls of the first and second wall regions have limited lengths.

3. The structure of claim 1, wherein, among the walls of the first and second wall regions, first walls of the first wall region are disposed along a first direction of the substrate and second walls of the second wall region are disposed along a second direction of the substrate.

4. The structure of claim 3, wherein the first direction and the second direction form a defined angle with each other, and the defined angle is an angle that reduces mechanical stress within the structure.

5. The structure of claim 3, wherein the first walls of the first wall region and the second walls of the second wall region are disposed symmetrically to balance mechanical stress along the first direction and the second direction of the substrate.

6. The structure of claim 1, wherein the rounded corner falls in a plane that is perpendicular to the base surface of the substrate.

7. The structure of claim 1, wherein the rounded corner falls in a plane that is parallel to the base surface of the substrate.

8. The structure of claim 1, wherein the multi-layer device comprises one or more structures of: a metal-insulator-semiconductor (MIS) structure, a semiconductor-insulator-semiconductor (SIS) structure, or a metal-insulator-metal (MIM) structure.

9. The structure of claim 8, wherein the one or more structures are stacked in series.

10. The structure of claim 1, wherein a space in between the protruding wall structure is partially unfilled.

11. The structure of claim 1, wherein the substrate is as an electrode of the multi-layer device.

* * * * *